United States Patent [19]

Yusa et al.

[11] Patent Number: 4,891,682
[45] Date of Patent: Jan. 2, 1990

[54] SOLID STATE IMAGE PICK-UP DEVICE HAVING A NUMBER OF STATIC INDUCTION TRANSISTOR IMAGE SENSORS

[75] Inventors: Atsushi Yusa, Ina; Hidetoshi Yamada, Tokyo; Takashi Mizusaki, Hamamatsu; Jun-ichi Nishizawa; Takashige Tamamushi, both of Sendai, all of Japan

[73] Assignee: Olympus Optical Co., Ltd., Japan

[21] Appl. No.: 557,004

[22] Filed: Dec. 1, 1983

[30] Foreign Application Priority Data

Dec. 14, 1982 [JP] Japan ................ 57-217764

[51] Int. Cl.$^4$ ............ H01L 27/14; H01L 31/00
[52] U.S. Cl. ............................ 357/30; 357/45
[58] Field of Search ................ 357/30, 41, 45

[56] References Cited

U.S. PATENT DOCUMENTS

| | | | |
|---|---|---|---|
| 3,931,463 | 1/1976 | Levine | 357/24 |
| 4,377,817 | 3/1983 | Nishizawa et al. | 357/30 |
| 4,467,341 | 8/1984 | Suzuki | 357/30 |

FOREIGN PATENT DOCUMENTS 0096725 12/1983 European Pat. Off. .
2083968 3/1982 United Kingdom .

OTHER PUBLICATIONS

"Static Induction Transistor Image Sensors"; IEEE Transactions on Electron Devices, vol. ED-26, No. 12, Dec., 1979.

Primary Examiner—William L. Sikes
Assistant Examiner—Robert E. Wise
Attorney, Agent, or Firm—Arnold, White & Durkee

[57] ABSTRACT

A solid state image pick-up device having a number of static induction transistor image sensors arranged in a matrix form, each static induction image sensor includes a drain region formed by an n+ substrate connected to the earth potential, a channel region formed by an n− epitaxial layer grown on the substrate, a ring-shaped p+ gate region formed in a surface of the epitaxial layer, an n+ source region formed in a part of the surface of the epitaxial layer surrounded by the ring-shaped gate region and a p+ overflow drain region formed in the surface of the substrate underneath the gate region. By adjusting a time duration of a shutter control signal having a positive voltage applied to the overflow drain region, a time period during which photocarriers, i.e. electrons are flown into the gate region and stored therein, can be controlled at will, and an electronic shutter function can be achieved.

14 Claims, 6 Drawing Sheets

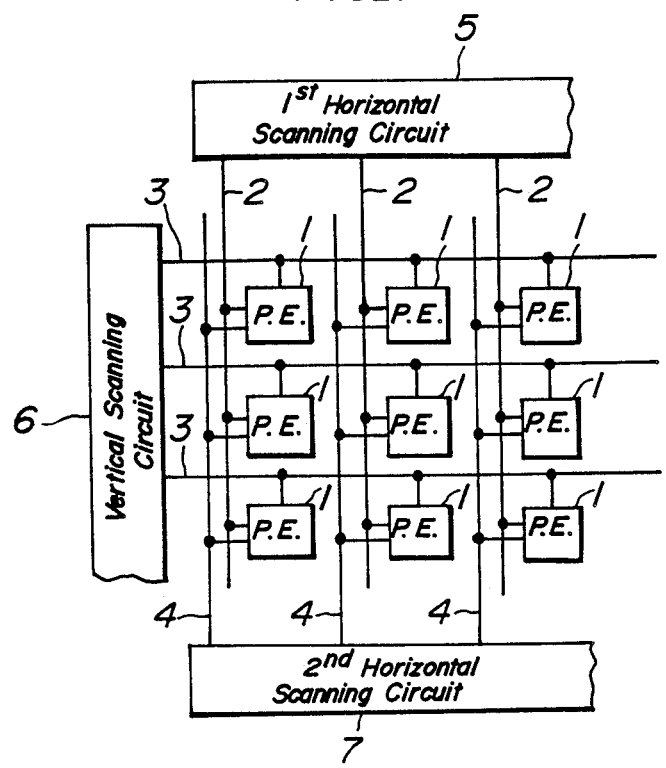
FIG_1
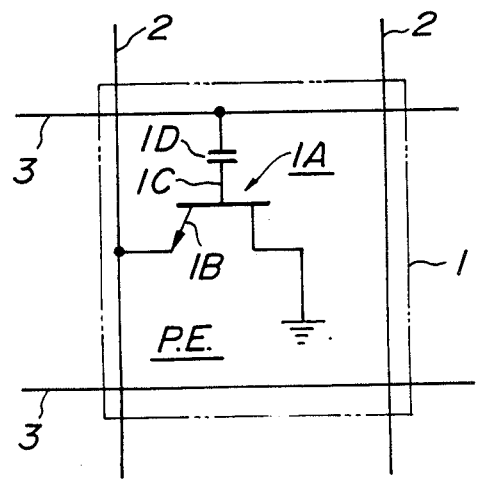
FIG_2

FIG_5A
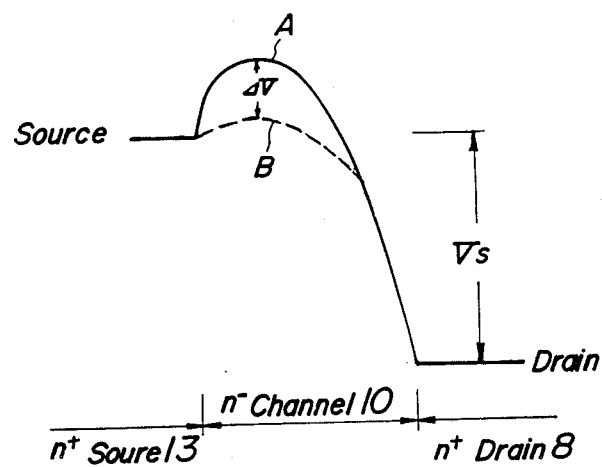
FIG_5B
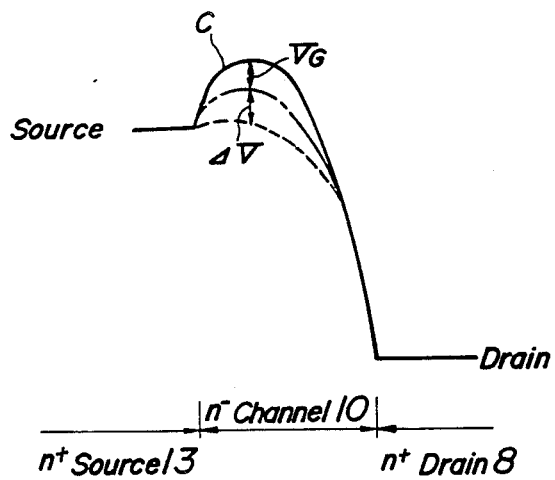

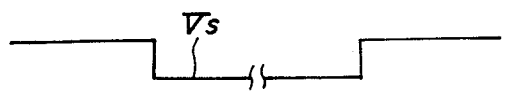
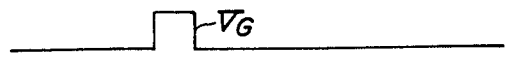
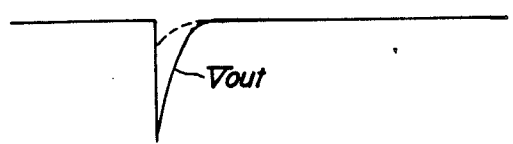

SOLID STATE IMAGE PICK-UP DEVICE HAVING A NUMBER OF STATIC INDUCTION TRANSISTOR IMAGE SENSORS

BACKGROUND OF THE INVENTION

The present invention relates to a solid state image pick-up device comprising an array of static induction transistor image sensors, each having a drain region of one conductivity type, a source region of one conductivity type, a gate region of a second conductivity type and a channel region of one conductivity type.

The static induction transistor image sensor (hereinafter referred to as SIT image sensor) has signal amplifying and switching functions as well as a photo-electrically converting function. Such a SIT image sensor has been described in detail in, for example, "Static Induction Transistor Image Sensors", IEEE TRANSACTIONS ON ELECTRON DEVICES, Vol. ED-26, No. 12, Dec., 1979, pp. 1970 to 1977.

In general, in order to pick-up an image of an object moving at a high speed, it is necessary to carry out the imaging with a higher shutter speed corresponding to the moving speed of the object. To this end, it is preferable to make the shutter speed adjustable over a wide range from 1/1000 second to several seconds. In a television camera having a known image tube, in order to read-out an image signal by effecting an interlace scanning at a field frequency of 60 Hz in the NTSC standard system, a photoelectric converting film of the image tube has to be charged-up at a rate of 1/60 second, and therefore the shutter speed can not be shorter than 1/60 second. Heretofore, in order to achieve a shorter shutter time than 1/60 second, use has been made of a mechanical shutter such as a rotary shutter provided in the front of the image tube. In such a mechanical shutter, the shutter speed is variable by changing the rotation speed of a rotary disc. It is apparent that the mechanical shutter provides serious problems in making the image pick-up device small in size and light in weight. Moreover, in the mechanical shutter, it is impossible or at least difficult to adjust the shutter speed at will. The above problem is also applied to a still camera comprising an image tube.

As the solid state image pick-up device, there has been developed a television camera comprising a charge coupled device (CCD). In such a device, an electronic shutter function can be attained by changing the change carrier storing time in the photoelectric converting action. Then, the shutter speed can be easily adjusted at will by externally applying an electrical signal to the device. However, in the solid state image pick-up device comprising SITs, such an electronic shutter function can not be achieved.

SUMMARY OF THE INVENTION

The present invention has for its object to provide a novel and useful solid state image pick-up device comprising SIT image sensors having photoelectric converting, signal amplifying and switching functions, in which the shutter speed can be adjusted at will in an electronic manner.

It is another object of the present invention to provide a solid state image pick-up device which is particularly suitable for application in television cameras or still cameras picking-up an image of an object moving at a high speed.

According to the invention, a solid state image pick-up device comprises
a plurality of static induction transistors having photoelectric converting, signal amplifying and switching functions each transistor having a source region of one conductivity type, a drain region of one conductivity type separated from said source region by means of a channel region of one conductivity type and a gate region of a second conductivity type separated from at least one of the source and drain regions by means of the channel region; and
means for driving the static induction transistors selectively to derive an image signal; the improvement is characterized in that each static induction transistor further comprises an overflow drain region of the a second conductivity type separated from the gate region by means of the channel region, and that
the pick-up device further comprises means for controlling externally the potential of the overflow drain region to adjust the time period during which photocarriers induced in the channel region due to light input are stored in the gate region to effect a shutter function.

BRIEF DESCRIPTION OF THE DRAWINGS

FIG. 1 is a circuit diagram showing an embodiment of the solid state image pick-up device comprising SIT image sensors according to the invention;

FIG. 2 is a circuit diagram illustrating a construction of a single picture element of the solid state image pick-up device;

FIGS. 5A and 5B are potential diagrams for explaining the photoelectric converting operation;

FIGS. 6A to 6C are signal waveforms for explaining the signal read-out operation;

FIGS. 7A to 7F are signal waveforms for explaining the switching operation;

DESCRIPTION OF THE PREFERRED EMBODIMENT

Figure 3:
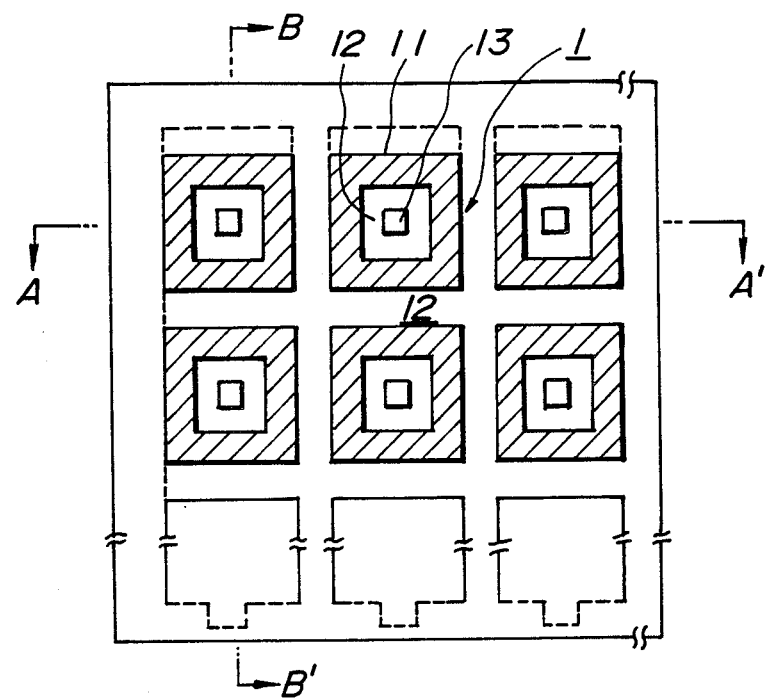
FIG. 3 is a plan view showing the construction of the SIT image sensor, while the conductor is removed.

FIG. 1 is a circuit diagram of the solid state image pick-up device according to the invention. In a common substrate are formed a number of picture elements 1 in a matrix form and to each of the picture elements are connected selection lines 2 and 3 for reading-out an image signal and signal lines 4 for setting an electronic shutter time as will be explained in detail hereinafter. The signal read-out lines 2 and 3 are connected to a first horizontal scanning circuit 5 and a vertical scanning circuit 6, respectively, and the shutter time control signal lines 4 are connected to a second horizontal scanning circuit 7. By applying scanning signals from the horizontal and vertical scanning circuits 5, 6 and 7 to the selection lines 2 and 3 and signal lines 4, the picture elements 1 are successively driven horizontally for respective lines to effect a so-called raster scan. According to the invention, by adjusting the pulse width of a driving pulse supplied from the second horizontal scanning circuit 7 to each picture element 1 via the signal lines 4, the photocarrier storing time can be controlled to set the electronic shutter speed to a desired speed. In the present embodiment, the solid state image pick-up device is applied to a television camera and comprises 400×500 picture elements 1, 400 picture elements being arranged in the horizontal direction and 500 picture elements being arranged in the vertical direction.

FIG. 2 is a circuit diagram showing the construction of a single picture element 1. The picture element 1 comprises a single SIT 1A having photoelectric converting, signal amplifying and switching functions. The SIT 1A has a source electrode 1B connected to the horizontal selection line 2, and a gate electrode 1C connected to the vertical selection line 3 via a storage capacitance 1D. The drain of the SIT is connected to the earth potential. Since the gate electrodes 1C of respective SITs are connected to the vertical selection lines 3 via respective capacitance 1D, the picture elements 1 are isolated from each other for the direct current.

Figure 4A:
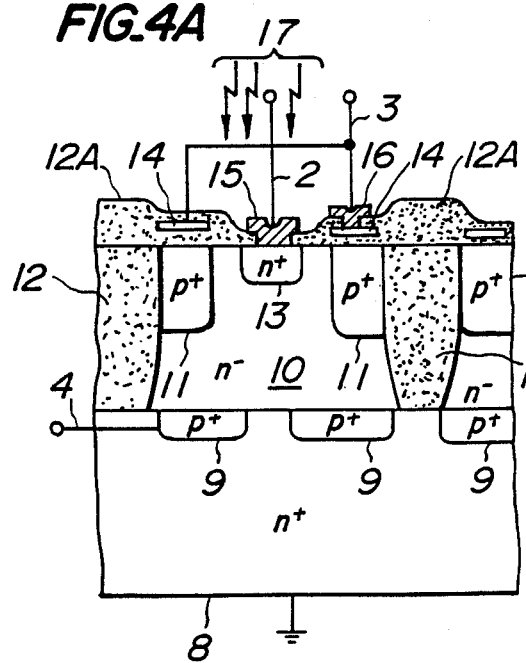
FIGS. 4A and 4B are cross sectional views cut along lines A—A' and B—B', respectively, in FIG. 3.
Figure 4B:
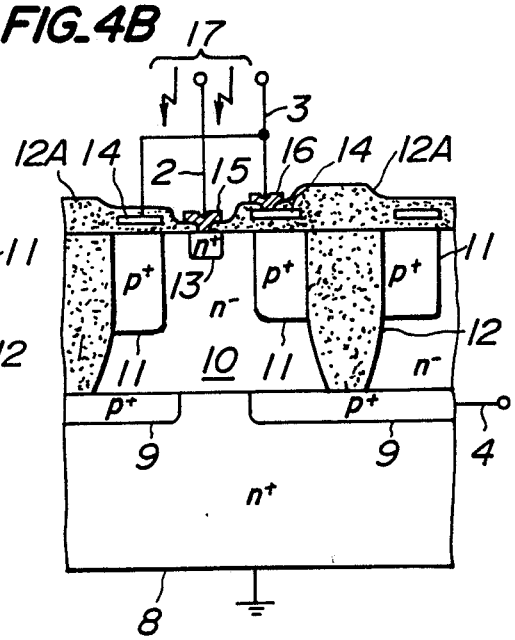

FIG. 3 is a plan view illustrating the solid state image pick-up device according to the invention, and in the drawing, the conductors forming the lines 2, 3 and 4 are removed for the sake of simplicity. FIGS. 4A and 4B are cross sectional views showing parts of the device cut along lines A—A′ and B—B′, respectively in FIG. 3. In FIGS. 3 4A, and 4B, the light receiving section consists of a common n+ semiconductor substrate 8 and an n⁻ silicon region 10 having a low impurity concentration and formed on the substrate by, for example, the CVD method. The n⁻ active layer may be an epitaxial layer grown on a surface of the substrate. Light input 17 is made incident upon the device from the side of the n⁻ silicon region 10. In the n⁻ silicon region 10 is formed an isolation region 12 made of insulating material such as SiO₂, the isolation region being extended from the surface of the n⁻ region 10 to a boundary surface between the substrate 8 and n⁻ region 10. The isolation region 12 serves to isolate the picture elements 1 from each other. In a part of the n⁻ silicon region 10 surrounded by the isolation region 12 are formed a p+ region 11 and a n+ region 13 by means of diffusion or ion implantation. According to the invention, in the surface of the substrate 8 is formed a p+ buried region 9. The n+ region 13, n+ substrate 8, p+ region 11 and n⁻ region 10 constitute a source, a drain, a gate and a channel, respectively of the SIT. As shown in the plan view of FIG. 3, the n+ source region 13 is surrounded by the ring-shaped p+ gate region 11 which is floating electrically. The p+ region 9 buried in the n+ substrate immediately below the p+ gate region 11 constitutes an overflow drain region which serves to absorb photocarriers induced in the n⁻ channel region 10. The overflow drain region 9 is separated by the isolation region 12 in the horizontal direction, but is extended continuously in the vertical direction, and its one end is connected to the signal line 4. The source region 13 is connected to a source electrode 15 made of electrode material such as low resistance polysilicon, aluminum, SnO₂ and InSnO. Above the p+ gate region 11 is provided a transparent electrode 14 made of SnO₂ or SnO₂-SbO₂ via an insulating film 12A made of the same insulating material as the isolation region 12. The electrode 14 is connected to the vertical selection line 3 via the storage capacitance 1D (FIG. 2). The vertical selection line 3 is connected to the transparent electrode 14 by means of a contact 16 made of polysilicon or metal such as aluminum. In the present embodiment shown in FIGS. 3, 4A, and 4B, the p+ gate region 11 and the source region 13 are separated from each other, but they may be brought into contact with each other.

Now the three functions of the SIT image sensor, i.e. (i) photoelectric converting function, (ii) signal read-out function, and (iii) shutter function due to the overflow drain region will be explained in that order.

(i) Photoelectric Converting Function

Now it is defined that an impurity concentration of the channel region 10 is $N_d$, a distance between the gate region 11 and the drain region 8 is $l_d$, an inner diameter of the gate region 11 surrounding the source region 13 is $2a$, and a diffusion potential is $V_B$. The device is designed and manufactured so that the following relations are satisfied in the case where negative voltage $V_S$ is applied to the source 15.

$$V_B = N_d \cdot q \cdot l_d^2 / 2 \cdot \epsilon$$

$$a = l_d$$

Then, the depletion layer extending from the junction between the gate region 11 and channel region 10 reaches the vicinity of the drain region 8 even if the gate bias voltage is zero. Further, parts of the depletion layer extending laterally from the mutually opposing sides of the gate region 11 are brought into contact with each other. This condition is called a pinch-off condition of the channel. In the pinch-off condition, the potential distribution profile viewed from the source region 13 to the drain region 8 has a high potential barrier in the channel region 10 as depicted by a solid curve A in FIG. 5A. Therefore, even though there is a potential difference $V_s$ between the source and drain, no current flows due to the barrier. Under such a pinch-off condition, when a light input 17 having energy larger than a forbidden band width of the semiconductor (silicon) is made incident upon the channel region 10, electron-hole pairs are induced in the channel region 10, the number of which is proportional to the intensity of the incident light 17. Due to the electric field generated in the channel region 10, electrons flow into the drain region 8 having the lower potential, and holes flow into the gate region 11 and are stored therein. When the holes are stored in the gate region 11, the gate potential becomes high, in accordance with the stored charges, and thus the potential barrier is lowered in proportion to the gate potential as shown by a broken curve B in FIG. 5A. In this manner, when the potential barrier is lowered, the electrons begin to flow from the source region 13 to the drain region 8. The magnitude of this current depends upon an amount $\Delta V$ of decrease in the potential barrier and this amount $\Delta V$ is in proportion to the intensity of the incident light 17. Therefore, between the source and drain flows a current having a magnitude proportional to the intensity of light input 17. In this manner the photoelectric converting function is carried out.

(ii) Signal Reading-out Function

Each of the picture elements effect the photoelectric converting function on the basis of the above explained operation. In order to effect the image sensing, it is necessary to read-out photocarriers from respective picture elements independently of each other. To this end, each picture element must have the switching function. The SIT used in the device according to the invention has the switching function as well as the photoelectric converting function. That is to say, the signal can be read-out by making the transistor conductive by applying a positive read-out pulse $V_G$ to the gate region 11 via the storage capacitance 1D. As illustrated in FIG. 5B the voltage applied to the gate region 11 shown by the solid curve C is a sum of the read-out pulse voltage $V_G$ and the voltage $\Delta V$ induced by the light illumination.

Now the signal reading-out operation will be explained in detail with reference to the timing charts shown in FIGS. 6A, 6B and 6C. FIG. 6A illustrates a negative voltage $V_S$ being applied to the source region 13 by means of the selection line 2, FIG. 6B illustrates the read-out pulse voltage $V_G$ being applied to the gate region 11 by means of the selection line 3, and FIG. 6C depicts a signal output voltage $V_{out}$ derived across a load resistor due to the signal current flowing between the source and drain. As apparent from the timing charts, the signal output voltage $V_{out}$ appears only when both the source pulse voltage $V_S$ and read-out pulse voltage $V_G$ are applied to the SIT. In FIG. 6C, a solid curve shows the signal output voltage in the case where the photocarries are accumulated, while a broken curve illustrates the case where no photocarrier is stored.

(iii) Shutter Function

For the sake of explanation, it is now assumed that four picture elements are arranged in a matrix form of 2×2. As shown in FIGS. 7A and 7B, to the sources of the picture elements are applied from the horizontal scanning circuit 5 signals $\phi H_1$ and $\phi H_2$ which are relatively shifted by a time period $T_H$ required for reading-out the signal from one vertical line. As illustrated in FIGS. 7C and 7D, read-out clock pulses $\phi V_1$ and $\phi V_2$ having a period equal to $T_H$ are applied from the vertical scanning circuit 6 to the gates of the SITs. These clock pulses $\phi V_1$ and $\phi V_2$ are shifted in phase by $T_V$ for each horizontal line. Therefore, one field period $T_F$ is equal to $2 \times T_H$. FIGS. 7E and 7F show shutter control signals $\phi H_1'$ and $\phi H_2'$ which are applied to the overflow drain regions 9 of the SITs from the second horizontal scanning circuit 7 in order to control the store time of the photocarriers. When the signals $\phi H_1'$ and $\phi H_2'$ are in a lower potential condition, the photocarriers (holes) induced in the channel region 10 are not stored in the gate region 11, but flow into the overflow drain region 9. Contrary to this, when the shutter control signals $\phi H_1'$ and $\phi H_2'$ are in a higher potential condition during the time period $T_A$, the holes generated in the channel region 10 do not flow into the overflow drain region 9, but are stored in the gate region 11. By effecting the above mentioned operation for each of the vertical lines, while the timing is shifted by $T_H$, all the picture elements can be read-out successively. As explained above, the time period $T_A$, i.e. the pulse width of the shutter control signal during which the photocarriers are stored in the gate region 11 corresponds to the shutter open time and this time period $T_A$ can be adjusted at will independently from the periods $T_H$ and $T_V$. Therefore, in the image pick-up device according to the invention, the shutter speed can be set at will. It is apparent that the time period $T_A$ can be simply externally changed at will. In this manner, according to the invention, the electronic shutter function can be attained.

Figures 8A, 8B:
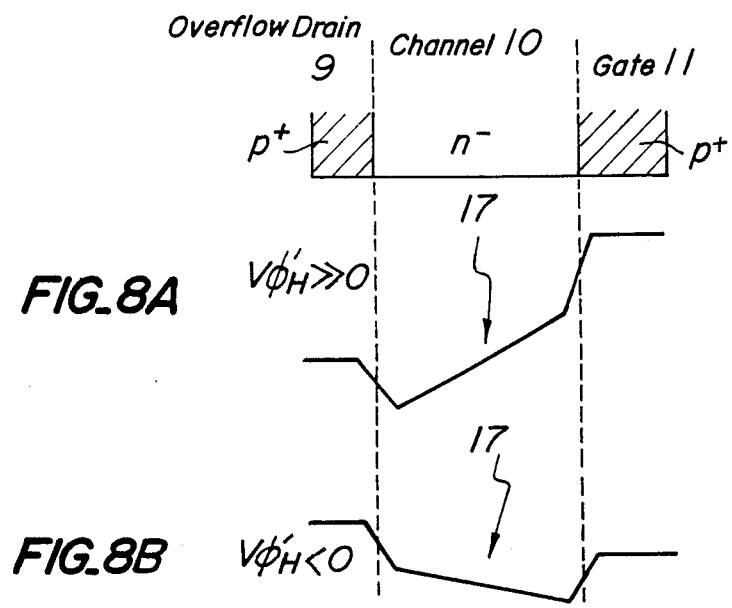
FIGS. 8A and 8B are potential diagrams for representing the photocarrier storing operation.

FIGS. 8A and 8B are potential diagrams of the overflow drain region 9, channel region 10 and gate region 11 when the shutter control signals shown in FIGS. 7E and 7F are applied to the overflow drain region 9. FIG. 8A shows the case when the signals $\phi H_1'$ and $\phi H_2'$ are at a higher potential condition and FIG. 8B illustrates the case in which the shutter control signals $\phi H_1'$ and $\phi H_2'$ are at a lower potential level. When a higher potential is applied to the overflow drain region 9, the potential increases from the overflow drain region 9 to the gate region 11 and therefore, the photocarriers, i.e. holes flow into the gate region 11 and are stored therein. Contrary to this, when the signal potential is low, the potential decreases from the overflow drain region 9 to the gate region 11 and then, the holes flow away from gate region 11 into the overflow drain region 9.

Figure 9:
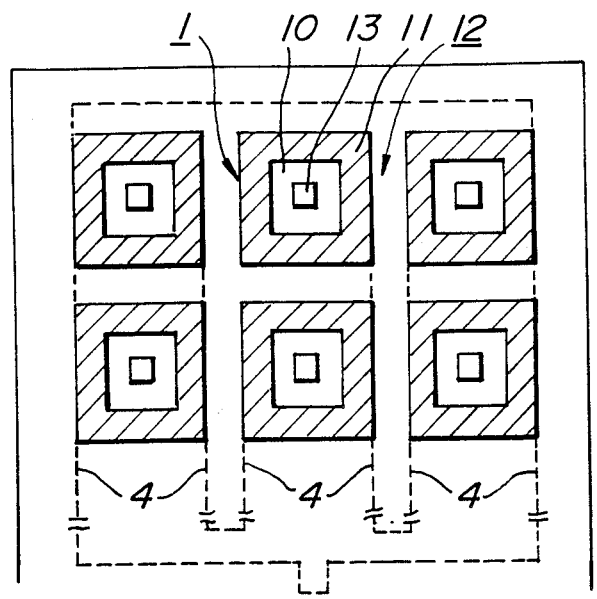
FIG. 9 is a plan view illustrating another embodiment of the solid state image pick-up device according to the invention applied to a still camera.

FIG. 9 shows an embodiment of the solid state image pick-up device according to the invention, which is applied to an electronic still camera. In the case of still photography, the storage of the photocarriers is effected simultaneously in all the picture elements, and then the signals stored in respective picture elements are read-out successively. Therefore, the shutter control signal $\phi H'$ can be simultaneously applied to the overflow drain regions of all the picture elements. For this purpose, as illustrated in FIG. 9, the signal lines 4 connected to the overflow drain regions of picture elements 1 are commonly connected to each other and the signal $\phi H'$ is a applied thereto. It is matter of course that the storage time, i.e. the shutter speed can be adjusted at will by controlling the time period $T_A$ of the shutter control signal $\phi H'$. The remaining construction of the image pick-up device shown in FIG. 9 is the same as that illustrated in FIGS. 3, and 4A, and 4B.

Figure 10:
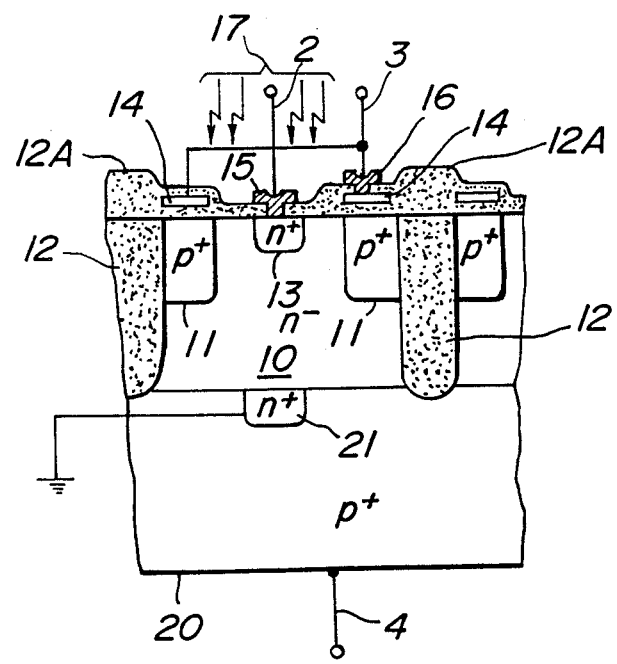
FIG. 10 is a cross sectional view showing still another embodiment of the solid state image pick-up device according to the invention applied to an electronic still camera.

FIG. 10 is a cross sectional view similar to FIG. 4A, showing another embodiment of the solid state image pick-up device according to the invention applied to an electronic still camera. In this embodiment, the overflow drain region is formed by a p+ substrate 20 and the drain region is constituted by a buried n+ region 21 formed in the surface of the substrate 20. The drain regions 21 of all the picture elements are commonly connected to the earth potential. By applying the shutter control signal $\phi H'$ to the p+ substrate 20, the storage of photocarriers can be simultaneously controlled in all the picture elements. The remaining portion has the same construction as that shown in FIGS. 3, 4A, and 4B and portions similar to those shown in FIGS. 3, 4A, and 4B are denoted by the same reference numerals used in those drawings.

As explained above in detail, in the solid state image pick-up device according to the invention, the electronic shutter function can be pertained to the SIT serving as the solid state image sensor and thus, it is possible to provide the television camera and still camera with an adjustable shutter time even shorter than 1/1000 second. Therefore, by picking-up an object moving at a high speed with a short shutter time, it is possible to increase the time resolution and to obtain a reproduced picture having an excellent image quality. For instance, in the case of a reproducing the image moving object in the slow motion or still mode by means of a video tape recorder, the above merit is manifested and a picture having the high image quality can be reproduced. Further, in the case of the still camera, since the video output signal can be read-out nondestractively from the SIT, the operation similar to the usual EE camera having the dominant shutter speed can be attained by effecting an automatic iris control in accordance with the read-out video signal level. Further, since the image pick-up device comprises the SITs as solid state image sensor, the device can inherently possess various properties such as high resolution, high sensitivity and a wide dynamic range, which are pertinent to the SIT.

The present invention is not limited to the embodiments explained above, but may be modified in various ways within the scope of the invention. For instance, the conductive types of the various regions may be revised to those of the previous embodiments.

What is claimed is:

1. In a solid state image pick-up device comprising a plurality of static induction transistors each transistor having a source region of one conductivity type, a drain region of one conductivity type separated from said source region by means of a channel region of one conductivity type and a gate region of a second conductivity type separated from at least one of said source and drain regions by means of said channel region, said channel region capable of generating photocarriers with light input; and means for driving said static induction transistors selectively to derive an image signal; each static induction transistor further comprising an overflow drain region of a second conductivity type separated from said gate region by means of said channel region, said overflow drain region having a potential, said overflow drain region being formed below said gate region and immediately adjacent said channel region; and said pick-up device further comprising means for externally controlling said potential of said overflow drain region to adjust a time period which photocarries induced in said channel region due to light input are stored in said gate region to effect a shutter function.

2. A solid state image pick-up device according to claim 1, wherein said drain region being formed by a semiconductor substrate, said source, channel and gate regions being formed in an active layer applied on a surface of said substrate, and said overflow drain region being formed by a region buried in said surface of said substrate.

3. A solid state image pick-up device according to claim 2, wherein said drain region being formed by an n+ substrate, said active layer being formed by an n− epitaxial layer grown on a surface of the n+ substrate, said gate region comprises a ring-shaped p+ region formed in a surface of said epitaxial layer, said source region comprises an n+ region formed in a part of said epitaxial layer surrounded by said ring-shaped gate region, and said overflow drain region being formed by a p+ region buried in said surface of said n+ substrate.

4. A solid state image pick-up device according to claim 3, wherein adjacent static induction transistors are isolated from each other by means of an isolation region extending from said surface of said epitaxial layer to said surface of said substrate.

5. A solid state image pick-up device according to claim 1, wherein said gate region completely surrounds said source region.

6. A solid state image pick-up device according to claim 5, wherein said gate region is separated from said source region.

7. A solid state image pick-up device according to claim 1, wherein said static induction transistors being arranged in a matrix form and said overflow drain regions of said static induction transistors aligned in a vertical direction are connected to each other.

8. A solid state image pick-up device according to claim 1, wherein said static induction transistors being arranged in a matrix form and said overflow drain regions of said static induction transistors aligned in a horizontal direction being connected to each other.

9. A solid state image pick-up device according to claim 1, wherein said overflow drain regions of all of said static induction transistors are connected to each other and the potential of all of said overflow drain regions being controlled simultaneously.

10. A solid state image pick-up device according to claim 9, wherein said overflow drain region being formed by a p+ substrate, said active layer being formed by an n− epitaxial layer grown on a surface of said p+ substrate, said gate region comprises a ring-shaped p+ region formed in a surface of said epitaxial layer, said source region comprises an n+ region formed in a part of said epitaxial layer surrounded by said ring-shaped p+ gate region, and said drain region being formed by an n+ region buried in said surface of said substrate underneath said n+ source region.

11. A solid state image pick-up device according to claim 10, wherein adjacent static induction transistors are isolated from each other by means of an isolation region extending from said surface of said epitaxial layer to said surface of said substrate.

12. A solid state image pick-up device according to claim 1, wherein said overflow drain regions of all of said static induction transistors being formed by a semiconductor substrate, said source, gate and channel regions being formed in an active layer applied on a surface of said substrate and said drain region being formed by a region buried in said surface of said substrate, whereby the potential of the overflow drain regions being simultaneously adjusted by changing the potential applied to the substrate.

13. A solid state image pick-up device according to claim 12, wherein said gate region completely surrounds said source region.

14. A solid state image pick-up device according to claim 13, wherein said gate region is separated from said source region.

* * * * *